United States Patent
Smith et al.

(10) Patent No.: US 12,538,587 B2
(45) Date of Patent: Jan. 27, 2026

(54) SOLAR CELL EMITTER REGION FABRICATION WITH DIFFERENTIATED P-TYPE AND N-TYPE LAYOUTS AND INCORPORATING DOTTED DIFFUSION

(71) Applicant: Maxeon Solar Pte. Ltd., Singapore (SG)

(72) Inventors: David Smith, Campbell, CA (US); Gerly Reich, San Jose, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 0 days.

(21) Appl. No.: 18/197,651

(22) Filed: May 15, 2023

(65) Prior Publication Data

US 2024/0387762 A1  Nov. 21, 2024

(51) Int. Cl.
- *H10F 10/14* (2025.01)
- *H10F 77/00* (2025.01)

(Continued)

(52) U.S. Cl.
CPC ......... *H10F 10/146* (2025.01); *H10F 77/219* (2025.01); *H10F 71/103* (2025.01);
(Continued)

(58) Field of Classification Search
CPC ......... H01L 31/0682; H01L 31/022441; H10F 10/146; H10F 77/219
See application file for complete search history.

(56) References Cited

U.S. PATENT DOCUMENTS

| | | | |
|---|---|---|---|
| 2012/0247560 A1* | 10/2012 | Rim | H01L 21/0245 438/57 |
| 2013/0228221 A1* | 9/2013 | Moslehi | H10F 71/139 438/98 |

(Continued)

FOREIGN PATENT DOCUMENTS

FR  3112430 A1  1/2022

OTHER PUBLICATIONS

Hellig, Matthias, et al., "A simplified and masking-free doping process for interdigitated back contact solar cells using an atmospheric pressure chemical vapor deposition borosilicate glass/phosphosilicate glass layer stack for laser doping followed by a high temperature step," Progress in Photovoltaics: Research and Applications, 2023, 10 pgs.

(Continued)

*Primary Examiner* — Lindsey A Buck
(74) *Attorney, Agent, or Firm* — Schwabe, Williamson & Wyatt, P.C.

(57) ABSTRACT

Methods of fabricating solar cell emitter regions with differentiated P-type and N-type layouts and incorporating dotted diffusion, and resulting solar cells, are described. In an example, a solar cell includes a substrate having a light-receiving surface and a back surface. A first polycrystalline silicon emitter region of a first conductivity type is on a first thin dielectric layer on the back surface of the substrate. A second polycrystalline silicon emitter region of a second, different, conductivity type is on a second thin dielectric layer on the back surface of the substrate. The second polycrystalline silicon emitter region has a vertical thickness less than a vertical thickness of the first polycrystalline silicon emitter region.

13 Claims, 7 Drawing Sheets

(51) Int. Cl.
  *H10F 77/122* (2025.01)
  *H10F 77/14* (2025.01)
  *H10F 77/164* (2025.01)
  *H10F 77/166* (2025.01)
  *H10F 77/20* (2025.01)
  *H10F 71/00* (2025.01)
  *H10F 71/10* (2025.01)

(52) U.S. Cl.
  CPC ........ *H10F 71/1221* (2025.01); *H10F 77/122* (2025.01); *H10F 77/148* (2025.01); *H10F 77/1642* (2025.01); *H10F 77/1662* (2025.01); *H10F 77/935* (2025.01)

(56) References Cited

U.S. PATENT DOCUMENTS

| | | | |
|---|---|---|---|
| 2016/0027951 | A1 | 1/2016 | Shim et al. |
| 2018/0175221 | A1 | 6/2018 | Smith et al. |
| 2019/0207041 | A1* | 7/2019 | Rim ................. H01L 31/028 |
| 2021/0036171 | A1* | 2/2021 | Westerberg ......... H01L 31/0745 |

OTHER PUBLICATIONS

International Search Report and Written Opinion from PCT/SG2024/050261 dated Jun. 28, 2024, 11 pgs.

* cited by examiner

SOLAR CELL EMITTER REGION FABRICATION WITH DIFFERENTIATED P-TYPE AND N-TYPE LAYOUTS AND INCORPORATING DOTTED DIFFUSION

TECHNICAL FIELD

Embodiments of the present disclosure are in the field of renewable energy and, in particular, methods of fabricating solar cell emitter regions with differentiated P-type and N-type layouts and incorporating dotted diffusion, and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

DETAILED DESCRIPTION

Figure 1A:
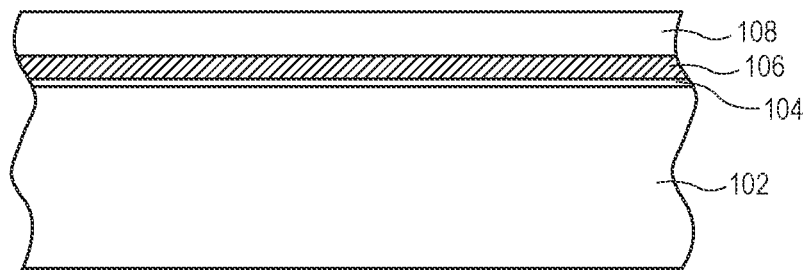
FIGS. 1A-1C illustrate cross-sectional and plan views of various stages in the fabrication of a solar cell.

The following detailed description is merely illustrative in nature and is not intended to limit the embodiments or the application and uses of such embodiments. As used herein, the word "exemplary" means "serving as an example, instance, or illustration." Any implementation described herein as exemplary is not necessarily preferred or advantageous over other implementations. Furthermore, there is no intention to be bound by any expressed or implied theory presented in the preceding technical field, background, brief summary or the following detailed description.

References to "one embodiment" or "an embodiment." do not necessarily refer to the same embodiment. Particular features, structures, or characteristics can be combined in any suitable manner consistent with this disclosure.

Terminology. The following paragraphs provide definitions and/or context for terms found in this disclosure (including the appended claims):

"Comprising" is open-ended term does not foreclose additional structure or steps.

"Configured to" connotes structure by indicating that a device, such as a unit or a component, includes structure that performs a task or tasks during operation, such structure is configured to perform the task even when the device is not currently operational (e.g., is not on/active). A device "configured to" perform one or more tasks is expressly intended to not invoke a means or step plus function interpretations under 35 U.S.C. § 112, (f) or sixth paragraph.

"First," "second," etc. terms are used as labels for nouns that they precede, and do not imply any type of ordering (e.g., spatial, temporal, logical, etc.). For example, reference to a "first" solar cell does not necessarily mean such solar cell in a sequence; instead the term "first" is used to differentiate this solar cell from another solar cell (e.g., a "second" solar cell).

"Coupled" refers to elements, features, structures or nodes unless expressly stated otherwise, that are or can be directly or indirectly joined or in communication with another element/node/feature, and not necessarily directly mechanically joined together.

"Inhibit" describes reducing, lessening, minimizing or effectively or actually eliminating something, such as completely preventing a result, outcome or future state completely.

"Doped regions," "semiconductor regions," and similar terms describe regions of a semiconductor in, on, above or over a substrate. Such regions can have an N-type conductivity or a P-type conductivity, and doping concentrations can vary. Such regions can refer to a plurality of regions, such as first doped regions, second doped regions, first semiconductor regions, second semiconductor regions, etc. The regions can be formed of a polycrystalline silicon on a substrate or as portions of the substrate itself.

"Thin dielectric layer," "tunneling dielectric layer," "dielectric layer," "thin dielectric material" or intervening layer/material refers to a material on a semiconductor region, between a substrate and another semiconductor layer, or between doped or semiconductor regions on or in a substrate. In an embodiment, the thin dielectric layer can be a tunneling oxide or nitride layer of a thickness of approximately 2 nanometers or less. The thin dielectric layer can be referred to as a very thin dielectric layer, through which electrical conduction can be achieved. The conduction can be due to quantum tunneling and/or the presence of small regions of direct physical connection through thin spots in the dielectric layer. Exemplary materials include silicon oxide, silicon dioxide, silicon nitride, and other dielectric materials.

"Intervening layer" or "insulating layer" describes a layer that provides for electrical insulation, passivation, and inhibit light reflectivity. An intervening layer can be several layers, for example a stack of intervening layers. In some contexts, the insulating layer can be interchanged with a tunneling dielectric layer, while in others the insulating layer is a masking layer or an "antireflective coating layer" (ARC layer). Exemplary materials include silicon nitride, silicon oxynitride, silicon dioxide, aluminum oxide, amorphous silicon, polycrystalline silicon, molybdenum oxide, tungsten oxide, indium tin oxide, tin oxide, vanadium oxide, titanium oxide, silicon carbide and other materials. In an example, the intervening layer can include a material that can act as a moisture barrier. Also, for example, the insulating layer can be a passivation layer for a solar cell.

"Substrate" can refer to, but is not limited to, semiconductor substrates, such as silicon, and specifically such as single crystalline silicon substrates, multi-crystalline silicon substrates, wafers, silicon wafers and other semiconductor substrates used for solar cells. In an example, such substrates can be used in micro-electronic devices, photovoltaic cells or solar cells, diodes, photo-diodes, printed circuit boards, and other devices. These terms are used interchangeably herein.

"About" or "approximately". As used herein, the terms "about" or "approximately" in reference to a recited numeric value, including for example, whole numbers, fractions, and/or percentages, generally indicates that the recited numeric value encompasses a range of numerical values (e.g., +/−5% to 10% of the recited value) that one of ordinary skill in the art would consider equivalent to the recited value (e.g., performing substantially the same function, acting in substantially the same way, and/or having substantially the same result).

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Methods of fabricating solar cell emitter regions with differentiated P-type and N-type layouts and incorporating dotted diffusion, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be appreciated that the various embodiments shown in the figures are illustrative representations and are not necessarily drawn to scale.

Disclosed herein are solar cells. In one embodiment, a solar cell includes a substrate having a light-receiving surface and a back surface. A first polycrystalline silicon emitter region of a first conductivity type is on a first thin dielectric layer on the back surface of the substrate. A second polycrystalline silicon emitter region of a second, different, conductivity type is on a second thin dielectric layer on the back surface of the substrate. The second polycrystalline silicon emitter region has a vertical thickness less than a vertical thickness of the first polycrystalline silicon emitter region.

Also disclosed herein are methods of fabricating solar cells. In an embodiment, a method of fabricating a solar cell involves forming an N+ polycrystalline silicon layer on a thin dielectric layer on a back surface of a substrate, forming a boron doped silica glass (BSG) layer on the N+ polycrystalline silicon layer, forming an amorphous silicon (aSi) layer on the BSG layer, performing laser ablating to form an opening in the aSi layer and the BSG layer and to dope a region of the N+ polycrystalline silicon layer and to leave outer unmodified regions of the N+ polycrystalline silicon layer exposed, etching to remove the exposed outer unmodified regions of the N+ polycrystalline silicon layer to form N+ polycrystalline silicon emitter regions and a remnant polycrystalline silicon region beneath a boron-doped silicon cap, etching to remove the boron-doped silicon cap and to leave remaining a remnant polycrystalline silicon region, and doping the remnant polycrystalline silicon region to form a P+ polycrystalline silicon emitter region.

In another embodiment, a method of fabricating a solar cell involves providing a substrate having a light-receiving surface and a back surface. The method includes forming a first polycrystalline silicon emitter region of a first conductivity type on a first thin dielectric layer on the back surface of the substrate. The method includes forming a second polycrystalline silicon emitter region of a second, different, conductivity type on a second thin dielectric layer on the back surface of the substrate. The second polycrystalline silicon emitter region has a vertical thickness less than a vertical thickness of the first polycrystalline silicon emitter region.

One or more embodiments described herein are directed to the fabrication of a solar cell with dotted diffusion. In an embodiment, implementing a dotted-diffusion design with a differentiated P-type and N-type layouts enables the fabrication of laser patterned emitters with more stable and lower reverse bias breakdown. The dotted diffusion may be fabricated using laser ablation, as described in greater detail below. However, in other embodiment, non-laser island diffusion formation may also be implemented, e.g., through the use of printed etchants, or through masking and etching approaches.

Solar cell efficiency is an important operational characteristic of solar cells as solar cell efficiency is directly related to its capacity to generate power. Carrier recombination is a significant factor in the determination of solar cell efficiency because carriers that recombine may not provide a net contribution to the current that is produced by a solar cell. Diffused trenches (e.g., trenches with a diffusion of dopants into portions of the substrate volume that underlies them) can be the part of the surface of a solar cell with the least favorable recombination properties. In addition, the parts of the surface of a solar cell where metal components come into contact with the semiconductor substrate can have unfavorable carrier recombination properties.

To provide context, using a laser to pattern an emitter in a traditional solar cell architecture may be challenging since, with a linear emitter, a significant area of material requires removal. The removal may be difficult to perform and may pose a units per hour (UPH) challenge when diode-pumped solid state (DPSS) lasers are used. Some designs also rely on an edge vertical sidewall junction as a pathway for reverse-bias breakdown, and therefore need to be very uniform. Use of a "clean" laser process to form such an edge vertical sidewall junction may be difficult where overlapping dots are used, as would normally be the case for a pulsed laser forming a continuous emitter. Reverse break-down voltage is also proportional to the length of the butting junction that serves as the break-down region.

Addressing one or more of the above issues, in an embodiment, moving to a dotted design, where the spot size can be easily controlled, and high-densities of dots can be placed, may lead to improved break-down performance of the device. In particular embodiments, forming an array of dots as the emitter can enable faster laser processing, more uniform ablation (e.g., non-overlapping dots) for better sidewalls, use of lower-energies (e.g., opens up UV laser options, which is also better for side-wall uniformity), and can improve the breakdown-voltage. Other benefits of using a dotted emitter design with a differentiated P-type and N-type architecture may include one or more of (1) increasing junction area to enable lower breakdown voltage; (2) eliminating a need for overlap to form a continuous emitter; (3) improving UPH issues; (4) improving edge-overlap and control issue; (5) reducing island contacting issues by using blanket N-type amorphous silicon (n-a-Si) deposition; (6) enabling the formation of single, double, triples etc. rows of discrete regions of the substrate ('islands'); (7) enabling tuning of island size; and/or (8) enabling use of a UV or $CO_2$ based laser source to cleanly remove an oxide and create clean side-walls, without significant damage to the emitter.

To provide further context, earlier approaches have included implementing a dotted-diffusion design with a differentiated P-type and N-type architectures. As a comparative process flow, FIGS. 1A-1C illustrate cross-sectional views of various stages in the fabrication of a solar cell.

Figure 1B:
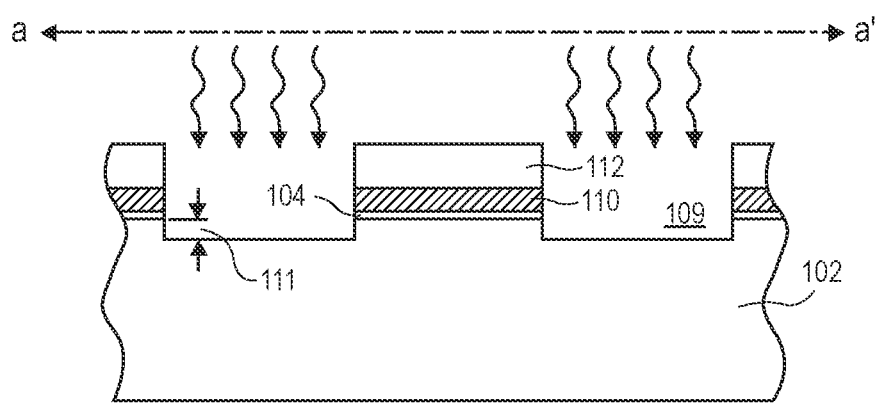
Figure 1B:
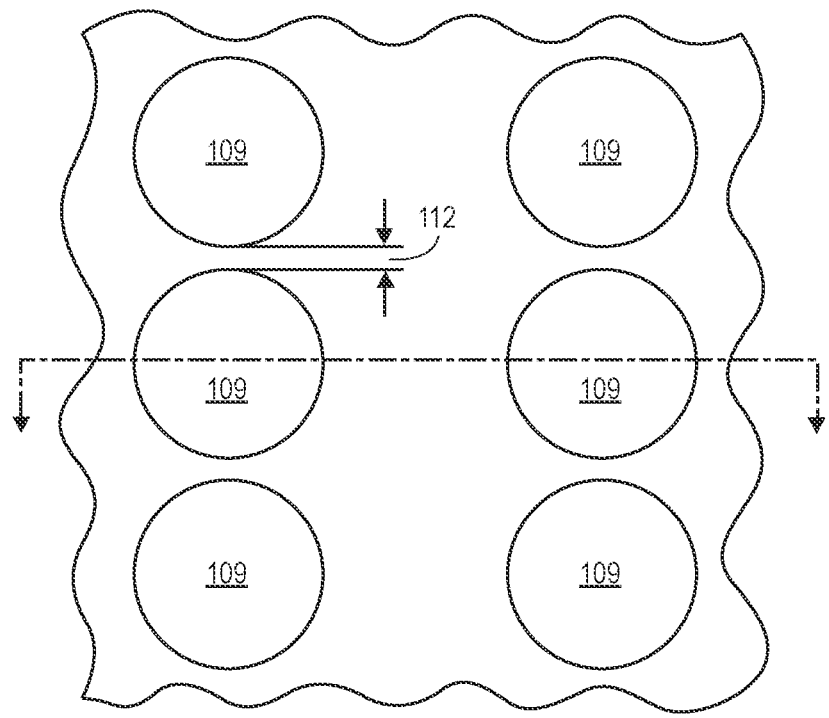
Figure 1C:
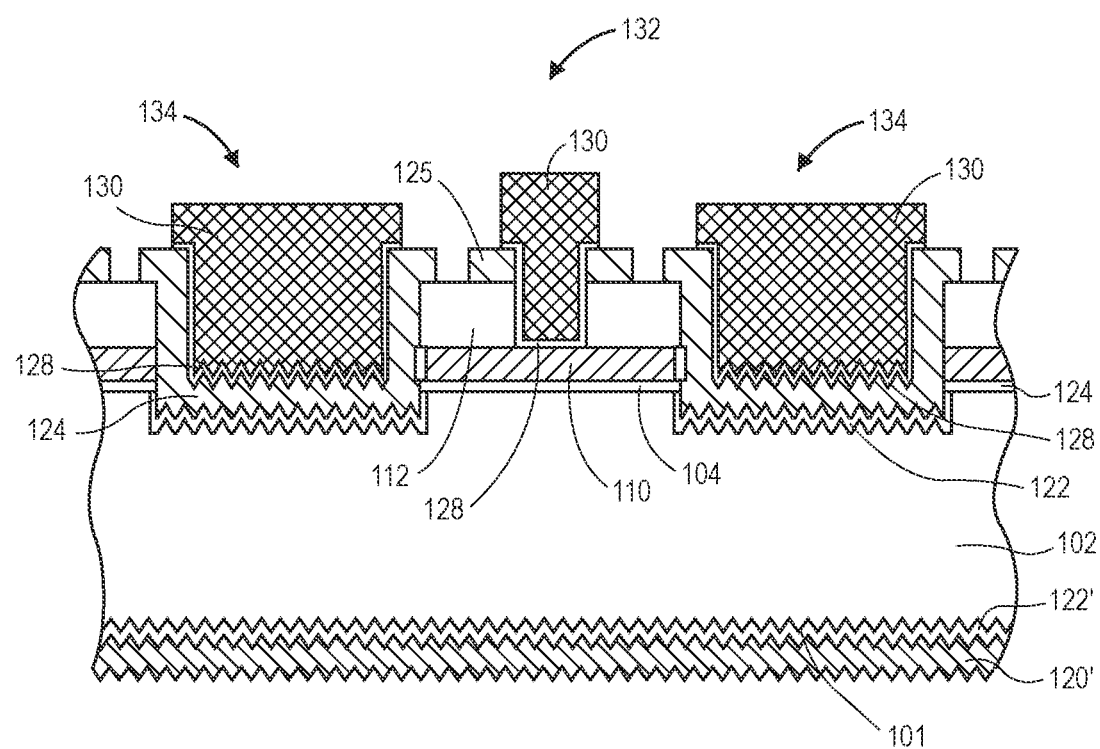

Referring to FIG. 1A, a method of fabricating alternating N-type and P-type emitter regions of a solar cell involves forming a first silicon layer 106 of a first conductivity type on a first thin dielectric layer 104 formed on a back surface of a substrate 102.

In an example, the substrate 102 is a monocrystalline silicon substrate, such as a bulk single crystalline N-type doped silicon substrate. It is to be appreciated, however, that substrate 102 may be a layer, such as a multi-crystalline silicon layer, on a global solar cell substrate. In an example, the first thin dielectric layer 104 is a thin oxide layer such as a tunnel dielectric silicon oxide layer having a thickness of approximately 2 nanometers or less.

In an example, the first silicon layer 106 is a polycrystalline silicon layer that is doped to have the first conductivity type either through in situ doping, post deposition implanting, or a combination thereof. In another example the first silicon layer 106 is an amorphous silicon layer such as a hydrogenated silicon layer represented by a-Si: H which is implanted with dopants of the first conductivity type subsequent to deposition of the amorphous silicon layer. In one such example, the first silicon layer 106 is subsequently annealed (at least at some subsequent stage of the process flow) to ultimately form a polycrystalline silicon layer. In an example, for either a polycrystalline silicon layer or an amorphous silicon layer, if post deposition implantation is performed, the implanting is performed by using ion beam implantation or plasma immersion implantation. In one such example, a shadow mask is used for the implanting. In a specific example, the first conductivity type is P-type (e.g., formed using boron impurity atoms).

Referring again to FIG. 1A, an insulating layer 108 is formed on the first silicon layer 106. In an example the insulating layer 108 includes silicon dioxide.

Referring to FIG. 1B, the insulating layer 108 and the first silicon layer 106 are patterned to form a first silicon region 110 of the first conductivity type having an insulating cap 112 thereon. In an example, a laser ablation process (e.g., direct write) is used to pattern the insulating layer 108 and the first silicon layer 106. Where applicable, in one example, the first thin dielectric layer 104 is also patterned in the process, as is depicted in FIG. 1B. It is to be appreciated that the cross-sectional view of FIG. 1B is taken along the a-a' axis of the plan view of FIG. 1B.

In an example, the laser ablation process of FIG. 1B exposes a plurality of regions 109 of an N-type monocrystalline silicon substrate 102. Each of the plurality of regions 109 of the N-type monocrystalline silicon substrate 102 can be viewed as a plurality of non-continuous trenches 111 (seen in the cross-sectional view) having a spacing 112 between trenches (spacing seen in the plan view) formed in the N-type monocrystalline silicon substrate 102. The option that the trenches 109 have a depth or thickness 111 into the substrate is depicted in the cross-sectional view of FIG. 1B. In one such example, each of the plurality of non-continuous trenches 109 is formed to a non-zero depth 111 less than approximately 10 microns into the substrate 102 upon laser ablation.

As mentioned above, the plurality of openings and the corresponding plurality of non-continuous trenches 109 may be formed by applying a laser ablation process. In an example, using the laser ablation process provides each of the plurality of non-continuous trenches with a width (e.g., maximum diameter) approximately in the range of 30-60 microns. In one such example, successive ones of the plurality of non-continuous trenches 109 is formed as spaced apart at a distance approximately in the range of 50-300 microns. A distance of much less than 50 microns may lead to possibility of overlap of trenches, which may not be desirable, as described above. On the other hand, a distance of much greater than 300 microns may lead to increased contact resistance for a contact subsequently formed and linking several of the trenches 109. In an example, the laser ablation process involves using a laser beam having an approximately Gaussian profile or having an approximately flat-top profile.

Next, the surfaces of the trenches 109 may be texturized to form texturized recesses or trenches having texturized surfaces within the substrate 102. In a same or similar process, a light receiving surface of the substrate may also be texturized. In an example, a hydroxide-based wet etchant is used to form at least a portion of the recesses and/or to texturize exposed portions of the substrate 102. A texturized surface may be one which has a regular or an irregular shaped surface for scattering incoming light, decreasing the amount of light reflected off of the light-receiving and/or exposed surfaces of the solar cell. It is to be appreciated, however, that the texturizing of the back surface and even the recess formation may be omitted from the process flow. It is also to be appreciated that, if applied, the texturizing may increase the depth of the trenches 109 from the originally formed depth.

Next, a second thin dielectric layer is formed on exposed sides of the first silicon regions. In an example, the second thin dielectric layer is formed in an oxidation process and is a thin oxide layer such as a tunnel dielectric silicon oxide layer having a thickness of approximately 2 nanometers or less. In another example, the second thin dielectric layer is formed in a deposition process and is a thin silicon nitride layer or silicon oxynitride layer.

Next, a second silicon layer of a second, different, conductivity type is formed on a third thin dielectric layer formed on the exposed portions of the back surface of the substrate 102 (e.g., formed in each of the plurality of non-continuous trenches 109 of each of the plurality of regions of the N-type monocrystalline silicon substrate 102), and on the second thin dielectric layer and the insulating cap of the first silicon regions. The second silicon layer covers (from a top-down perspective) the trench regions 109.

Next, corresponding thin dielectric layer and second silicon layer of the second conductivity type may also be formed on the light-receiving surface of the substrate 102, in same or similar process operations. Additionally, an ARC layer may be formed on the corresponding second silicon layer.

In an example, the third thin dielectric layer 122 is formed in an oxidation process and is a thin oxide layer such as a tunnel dielectric silicon oxide layer having a thickness of approximately 2 nanometers or less. In an example, the second silicon layer is a polycrystalline silicon layer that is doped to have the second conductivity type either through in situ doping, post deposition implanting, or a combination thereof. In another example the second silicon layer is an amorphous silicon layer such as a hydrogenated silicon layer represented by a-Si: H which is implanted with dopants of the second conductivity type subsequent to deposition of the amorphous silicon layer. In one such example, the second silicon layer is subsequently annealed (at least at some subsequent stage of the process flow) to ultimately form a polycrystalline silicon layer. In an example, for either a polycrystalline silicon layer or an amorphous silicon layer, if post deposition implantation is performed, the implanting is performed by using ion beam implantation or plasma immersion implantation. In one such example, a shadow mask is used for the implanting. In a specific example, the second conductivity type is N-type (e.g., formed using phosphorus atoms or arsenic impurity atoms).

Next, the second silicon layer is patterned to form isolated second silicon regions of the second conductivity type and to form a contact opening in regions of the second silicon layer above the insulating cap of the first silicon regions. In an example, each isolated N-type silicon region is electrically coupled to a corresponding one (or more) of the plurality of regions 109 of the N-type monocrystalline silicon substrate. In an example, discrete regions of silicon may remain as an artifact of the patterning process. In an example, a laser ablation process is used to pattern the second silicon layer.

Next, the insulating cap is patterned through the contact openings to expose portions of the first silicon regions. In an example, the insulating cap is patterned using a laser ablation process. For example, in one example, a first laser pass is used to pattern the second silicon layer, including forming contact opening. A second laser pass in the same location as contact opening is the used to pattern the insulating cap. In an example, a single isolated region (e.g., a single isolated N-type silicon region) covers, from a top-down perspective, a strip of a plurality of the openings 109.

Referring to FIG. 1C, a plurality of conductive contacts is formed, each conductive contact electrically connected to one of the P-type silicon regions or one of the isolated N-type silicon regions. In an exemplary example, a metal seed layer 128 is formed on the exposed portions of the first silicon regions 110 and on the isolated second silicon regions 124. A metal layer 130 is then plated on the metal seed layer to form conductive contacts 132 and 134, respectively, for the first silicon regions 110 and the isolated second silicon regions 124. In an example, the metal seed layer 128 is an aluminum-based metal seed layer, and the metal layer 130 is a copper layer. In an example, a mask is first formed to expose only the exposed portions of the first silicon regions 110 and the isolated second silicon regions 124 in order to direct the metal seed layer 128 formation to restricted locations.

With reference again to FIG. 1C, in an example, a finalized solar cell includes a substrate 102 having a light-receiving surface 101 and a corresponding back surface. A first polycrystalline silicon emitter region 110 of a first conductivity type is on a first thin dielectric layer 104 on the back surface of the substrate 102. A second polycrystalline silicon emitter region 124 of a second, different, conductivity type is on a second thin dielectric layer 122 in a plurality of non-continuous trenches (shown as recess in cross-sectional view of FIG. 1C) in the back surface of the substrate 102. In an example, the substrate 102 is an N-type monocrystalline silicon substrate, the first conductivity type is P-type, and the second conductivity type is N-type. In an example, the solar cell is a back contact solar cell, as is depicted in FIG. 1C.

In an example, each of the plurality of non-continuous trenches has a width approximately in the range of 30-60 microns, as was described in association with FIG. 1B. In an example, successive ones of the plurality of non-continuous trenches are spaced apart at a distance approximately in the range of 50-300 microns, as was also described in association with FIG. 1B. In an example, each of the plurality of non-continuous trenches has a depth approximately in the range of 0.5-10 microns, as taken from the back surface and into the substrate 102. The final trench depth may be formed from laser ablation, a texturizing process, or both. In an example, each of the non-continuous trenches has an approximately circular shape in the plan view. As depicted in FIG. 1C, each of the non-continuous trenches has a texturized surface.

Referring again to FIG. 1C, in an example, the solar cell further includes a third thin dielectric layer 118 laterally directly between the first 110 and second 124 polycrystalline silicon emitter regions. In an example, the solar cell further includes a first conductive contact structure 130 electrically connected to the first polycrystalline silicon emitter region 110, and a second conductive contact structure 134 electrically connected to the second polycrystalline silicon emitter region 124. In an example, the solar cell further includes an insulator layer 112 on the first polycrystalline silicon emitter region 110. The first conductive contact structure 130 is through the insulator layer 112. In one such example, a portion of the second polycrystalline silicon emitter region 124 overlaps the insulator layer 112 but is separated from the first conductive contact structure 130, as is depicted in FIG. 1C. In a further example, a polycrystalline silicon region 125 of the second conductivity type is on the insulator layer 112, and the first conductive contact structure 130 is through the polycrystalline silicon region 125 of the second conductivity type and through the insulator layer 112, as is depicted in FIG. 1C.

In another aspect, to provide further context, earlier approaches have included implementing a dotted-diffusion design with differentiated P-type and N-type layouts.

In one example, diffused trenches with narrow dimensions are enabled by self-alignment processes. The limiting of the width of trenches which are the part of the solar cell surface with the least favorable carrier recombination properties, can have a favorable effect on carrier recombination properties. In addition, in one example, because metal layers in the solar cell contact polysilicon and not the semiconductor substrate, another common source of unfavorable carrier recombination is avoided. Consequently, the solar cell architecture limits the opportunities for carrier recombination that may be available in differently designed solar cells. In one example, the limiting of opportunities for carrier recombination is designed to mitigate carrier recombination such that the voltage and the net contribution of carriers to the current that is produced by the solar cell, and the efficiency of the solar cell, is favorably affected.

Figure 2A:
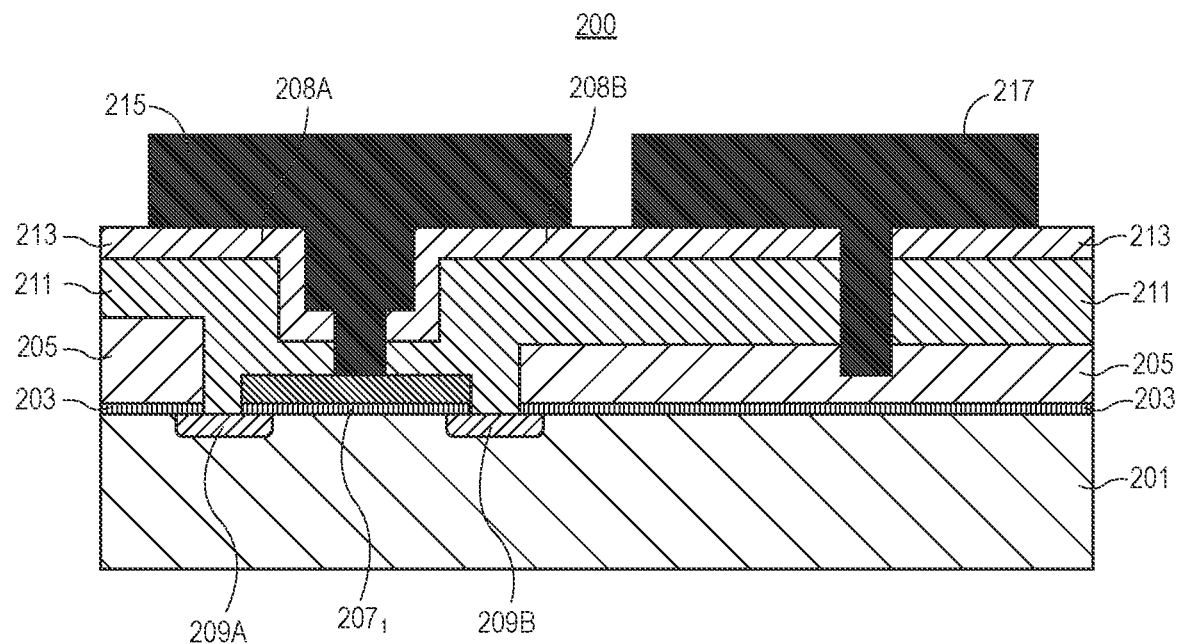
FIG. 2A illustrates a cross-section of a portion of a solar cell.

FIG. 2A illustrates a cross-section of a portion of a solar cell 200 (hereinafter "the solar cell 200") according to one example. It is to be appreciated that solar cell 200 can be fabricated using one or more process operations or material regimes described in association with FIGS. 1A-1C.

In one example, the solar cell 200 includes substrate 201, tunnel oxide 203, n-doped polysilicon 205, p-doped polysilicon $207_1$, trench 208a, trench 208b, doped region 209a, doped region 209b, insulating layer 211, insulating layer 213, wiring layer 215, and wiring layer 217.

Referring to FIG. 2A, the substrate 201 forms the substrate upon which the semiconductor, insulator and wiring layers of the solar cell 200 are formed. In one example, the tunnel oxide 203 is formed on the surface of the substrate 201 and includes spaces through which the doped regions 209a and 209b are formed, and in which the insulating layer 213 is formed. In one example, the p-doped polysilicon layer $207_1$ is formed on a portion of the tunnel oxide 203 that lies between portions of the tunnel oxide 203 located underneath laterally situated portions of the n-doped polysilicon layer 205. In one example, the p-doped polysilicon layer $207_1$ includes sides that are covered by the insulating layer 213 and a top surface that is partially covered by the insulating layer 213. In addition, in one example, the p-doped polysilicon layer $207_1$ is contacted on its top surface through a space in the insulating layer 213 by wiring layer 215. In one example, the n-doped polysilicon layer 205 is formed on the surface of the tunnel oxide 203 and is laterally separated from the p-doped polysilicon layer $207_1$ by portions of the insulating layer 213 that extend into spaces (on both sides of the p-doped polysilicon layer $207_1$) in the tunnel oxide 203. In one example, the doped region 209a is formed in the surface of substrate 201 below a portion of the insulating layer 213 that extends into a first space in the tunnel oxide 203. In one example, the doped region 209a laterally extends underneath a portion of the tunnel oxide 203 that is formed underneath the p-doped polysilicon layer $207_1$ and a portion of the tunnel oxide 203 that is formed underneath the n-doped polysilicon layer 205. In one example, the doped region 209b is formed in the surface of substrate 201 below a portion of the insulating layer 213 that extends into a second space in the tunnel oxide 203. In one example, the doped region 209b laterally extends underneath a portion of the tunnel oxide 203 that is formed underneath the p-doped polysilicon layer $207_1$ and a portion of the tunnel oxide 203 that is formed underneath the n-doped polysilicon layer 205. In one example, the insulating layer 213 is formed above insulating layer 211, along the bottom and sidewalls of the trenches 208a and 208b (that are located above the doped regions 209a and 209b), and on a the top surface of the p-doped polysilicon layer $207_1$. In one example, the insulating layer 213 includes openings above the p-doped polysilicon layer $207_1$ and the n-doped polysilicon layer 205 that enable the p-doped polysilicon layer $207_1$ and the n-doped polysilicon layer 205 to be contacted by the wiring layer 215 and the wiring layer 217 respectively. In one example, the insulating layer 211 is formed above the n-doped polysilicon layer 205 and includes an opening above the n-doped polysilicon layer 205 that enables the n-doped polysilicon layer to be contacted by the wiring layer 217. In one example, trenches 208a and 208b are opposite side cross-sectional parts of a trench (e.g., trench $208_1$ described with reference to FIG. 2B) that surrounds the p-doped polysilicon layer $207_1$.

Referring to FIG. 2A, in one example, wiring layer 215 can occupy a larger area than does the p-doped polysilicon layer $207_1$. However, in other examples, the wiring layer 215 can be confined to the area occupied by the p-doped polysilicon layer $207_1$, or to the area occupied by the p-doped polysilicon layer $207_1$ and the area occupied by the p-type doped regions 209a and 209b. In one example, the confinement of the wiring layer 215 to the semiconductor regions of p-type conductivity can involve the use of a larger p-type semiconductor area. In other examples, the confinement of the wiring layer 215 to the semiconductor regions of p-type conductivity may not involve the use of a larger p-type semiconductor area. In one example, the wiring layer 215 can be confined to p-type semiconductor regions that do not have continuous or contiguous configurations and can have a cell architecture with module interconnections that can include but is not limited to conductive circuit boards, such as for metallization wrap through (MWT) solar cells and interdigitated back contact (IBC) solar cells.

Figure 2B:
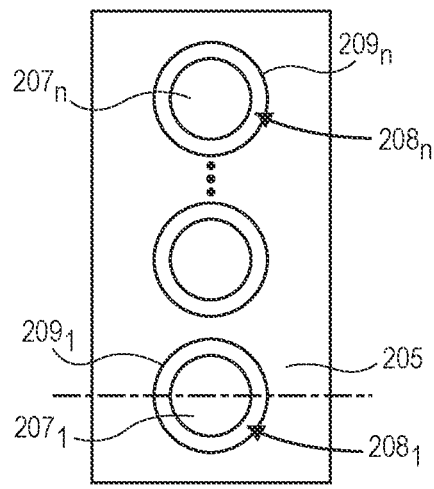
FIG. 2B illustrates an exemplary positioning of a plurality of circular trenches around a plurality of polysilicon structures in the solar cell of FIG. 2A.

Referring to FIG. 2B, in one example, the trenches 208a and 208b, shown in FIG. 2A, are opposite side cross-sectional parts of a trench $208_1$ that is formed around the p-doped polysilicon layer $207_1$ and above the doped region $209_1$. Moreover, in one example, the trench $208_1$ is one of a plurality of trenches $208_1$-$208_n$ formed around a plurality of polysilicon islands $207_1$-$207_n$ in solar cell 200 (in FIG. 2B the arrows indicate the location of the trenches $208_1$-$208_n$ relative to the doped regions $209_1$-$209_n$). In one example, the trenches can have shapes that include but are not limited to circular, rectangular, elongated, elliptical, polygonal and irregular. In one example, the polysilicon islands $207_1$-$207_n$ function as emitters that have surface areas that are a fraction of the surface area of the n-doped polysilicon layer 205 (emitter). In one example, the trenches $208_1$-$208_n$ are self-aligned. In one example, the self-alignment enables the formation of a narrower trench than can be obtained by some other processes. In one example, because a diffused trench can form a part of a surface area that may experience elevated levels of recombination, a narrow trench can operate to favorably affect recombination and performance.

In one example, the polysilicon islands $207_1$-$207_n$ are a plurality of non-contiguous doped polysilicon regions of p-type conductivity that are formed in lasered regions of the semiconductor structure. In one example, the wiring layer 215 (FIG. 2A), which is associated with semiconductor regions of p-type polarity (e.g., $207_1$-$207_n$), overlap semiconductor regions of n-type polarity (however in some other examples, overlap of the semiconductor regions of one polarity and the metallization associated with semiconductor regions of the other polarity is avoided).

In one example, the substrate 201 can be formed from silicon. In other examples, the substrate 201 can be formed from other materials. In one example, the tunnel oxide 203 can be formed from silicon oxide. In other examples, the tunnel oxide 203 can be formed from other materials. In one example, the doped polysilicon layer 205 can be doped with phosphorous. In other examples, the doped polysilicon layer 205 can be doped with other impurities. In one example, the doped polysilicon layer $207_1$ can be doped with boron. In other examples, the doped polysilicon layer $207_1$ can be doped with other impurities. In one example, the doped regions 209a and 209b can be doped with boron. In other examples, the doped regions 209a and 209b can be doped with other materials. In one example, the insulating layer 211 can include borophosphorous silicate glass and undoped silicate glass (hereinafter "BPSG (+USG)"). In other examples, insulating layer 211 can include other materials. In one example, the insulating layer 213 can include borosilicate glass and undoped silicate glass and silicon nitride (hereinafter "BSG (+USG)+SiN"). In other examples, the insulating layer 213 can include other materials. In one example, the wiring layer 215 can include aluminum, nickel, chromium, gold, germanium, copper, silver, titanium, tungsten, tin, platinum, and tantalum. In other examples, the wiring layer 215 can include other materials. In one example, the wiring layer 217 can include aluminum, nickel, chromium, gold, germanium, copper, silver, titanium, tungsten, tin, platinum, and tantalum. In other examples, the wiring layer 217 can include other materials.

In operation, upon exposure to light, the solar cell 200 converts light energy into electricity based on the photovoltaic effect. Some carriers reach the p-n junction and contribute to the current produced by the solar cell 200. However, other carriers recombine with no net contribution to the current produced by the solar cell 200. Carrier recombination is a significant factor in the determination of solar cell efficiency. Diffused trenches can be the part of the surface of the solar cell 200 that has the least favorable recombination properties. However, in one example, the narrowness of the diffused trenches 208a and 208b that is enabled by the self-alignment process, can be beneficial as regards carrier recombination in that part of the surface of the solar cell 200. Metal contacted doped regions are another significant source of carrier recombination. In one example, the solar cell 200 does not employ a direct metal contact of any part of the substrate 201. Thus, the solar cell 200 is designed in a manner that limits the opportunities for carrier recombination that may be available with differently designed solar cells. In one example, the limiting of opportunities for carrier recombination can have a favorable effect on carrier recombination and solar cell efficiency.

In another aspect, in accordance with one or more examples of the present disclosure, a dotted-diffusion design is implemented with differentiated P-type and N-type layouts and with differentiated P-type and N-type architectures. It is to be appreciated that the processes and solar cells described below can be fabricated using one or more process operations or material regimes or operational regimes described in association with FIGS. 1A-1C and 2A-2B.

To provide context, a state-of-the art process achieves 25.5% efficiency by high Npoly device side coverage. This produces good bulk lifetime and low device Jo. Half of the remaining Jo in the device total is the P type regions. They are currently 6% of the device side area and produce a total of 3.5 fA/cm2 of Jo. Embodiments described herein can be implemented to reduce this P type Jo value by introducing P type poly into the P type region without addition of extra process operations.

To provide further context, Npoly has a deposited masking film including an oxide and amorphous silicon. A first modification of the process involved use of a Boron and Phosphorous doped oxide stack instead of undoped oxide. The idea was that the boron doping portion would be laser processed and introduce dopants into a region of undoped poly in the p type regions that is boron doped. With a boron selective silicon etch, this region would resist etching, hence preserving a poly region. Then, in a furnace operation the Phosphorous and Boron would blend together in the oxide and Phosphorous would dominate the diffusion into the poly forming N type poly outside of the P type regions. In accordance with one or more embodiments of the present disclosure, to resolve this issue, the Phosphorous doped oxide component of the masking films is removed and pre-doped Npoly is used. In one embodiment, the phosphorous dopant is placed on the outer most layer of the Npoly and as thin as possible. After the initial boron selective poly etch to define the dot, a second non-boron selective etch is performed to etch back the top of the dot and remove the phosphorous dopant at the top of the stack. No space charge recombination is noted with this process.

Figure 5:
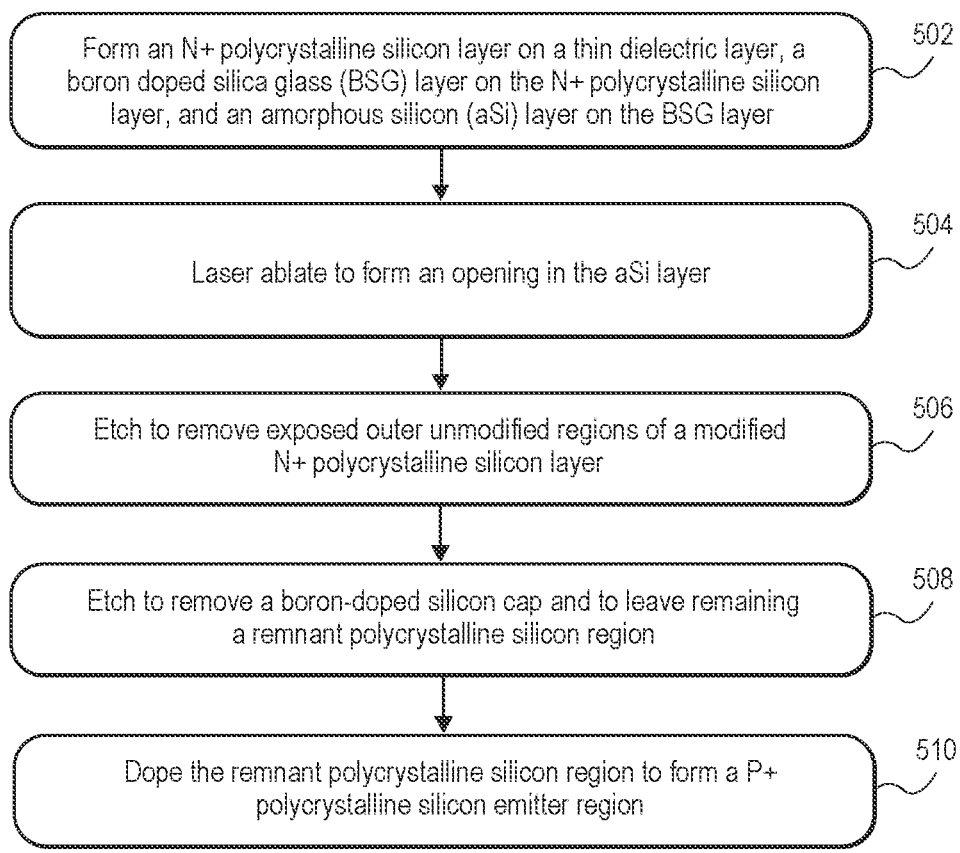
FIG. 5 is a flowchart listing operations in a method of fabricating a solar cell as corresponding to FIGS. 3A-3D, in accordance with an embodiment of the present disclosure.

As an exemplary process scheme, FIGS. 3A-3D illustrate cross-sectional views representing various operations in a method of fabricating a solar cell, in accordance with an embodiment of the present disclosure. FIG. 5 is a flowchart 500 listing operations in a method of fabricating a solar cell as corresponding to FIGS. 3A-3D, in accordance with an embodiment of the present disclosure. It is to be appreciated that the processes and solar cells described below can be fabricated using one or more process operations or material regimes or operational regimes described in association with FIGS. 1A-1C and 2A-2B.

Figure 3B:
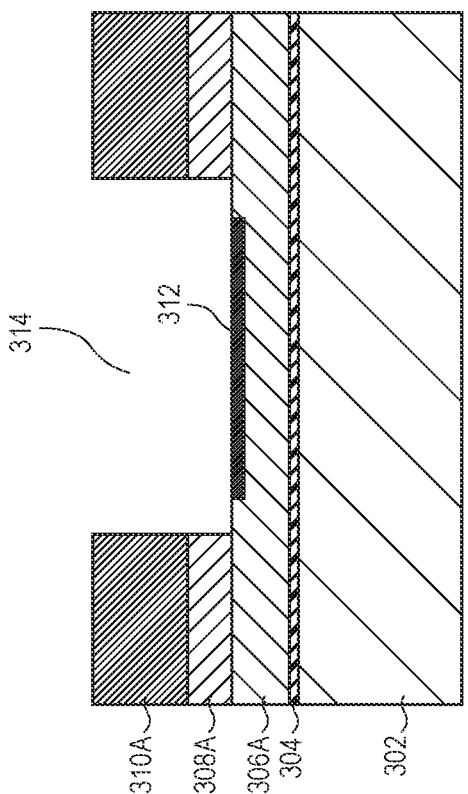
FIGS. 3A-3D illustrate cross-sectional views representing various operations in a method of fabricating a solar cell, in accordance with an embodiment of the present disclosure.
Figure 3A:
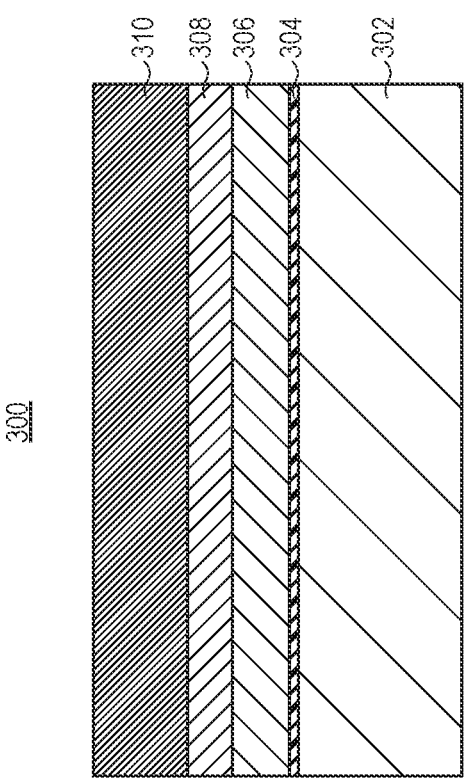

Referring to FIG. 3A, and to corresponding operation 502 of flowchart 500, forming a starting structure 300 includes forming an N+ polycrystalline silicon layer 306 on a thin dielectric layer 304 on the back surface of a substrate 302, such as a silicon substrate. A boron doped silica glass (BSG) layer 308 is formed on the N+ polycrystalline silicon layer 306. An amorphous silicon (aSi) layer 310 is formed on the BSG layer 308. In one embodiment, the N+ polycrystalline silicon layer 306 has a thickness in a range of 200-300 nanometers, e.g., a thickness of about 220 nanometers.

Referring to FIG. 3B, and to corresponding operation 504 of flowchart 500, the method includes laser ablating the structure of FIG. 3A to form an opening 314 in the aSi layer 310 and then etching the BSG layer 308, forming patterned aSi layer 310A and patterned BSG layer 308A. In an embodiment, during the laser ablating, the BSG layer 308 dopes a region of the underlying N+ polycrystalline silicon layer 306 with boron to form modified N+ polycrystalline silicon layer 306A with P+ region 312. In one such embodiment, the doping is centered within the opening 314 but does not entirely span the opening 314, leaving outer unmodified regions exposed. In a particular embodiment, the laser ablation is performed using a green laser having a top-hat profile. In an embodiment, the opening is a discrete circle, or other discrete shape such as a square or a rectangle. In another embodiment, the opening is a line. In an embodiment, a laser pulse ablates oxides and dopes a smaller center region with boron, resulting in a self-aligned boron doped poly structure within a dot.

Figure 3D:
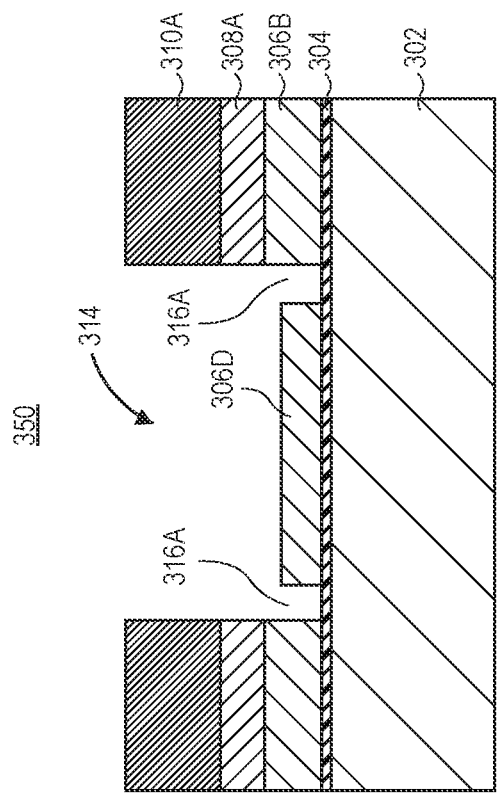
Figure 3C:
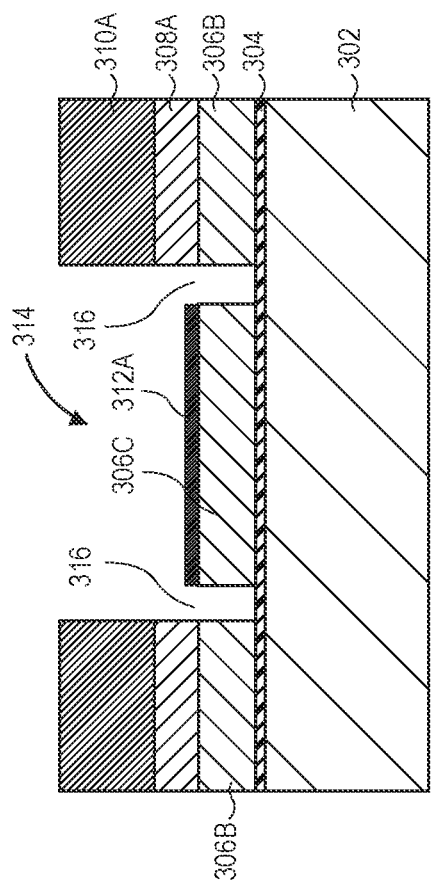

Referring to FIG. 3C, and to corresponding operation 506 of flowchart 500, the method includes etching the structure of FIG. 3B to remove the exposed outer unmodified regions of the modified N+ polycrystalline silicon layer 306A to form N+ polycrystalline silicon emitter regions 306B and a remnant polycrystalline silicon region 306C beneath the boron-doped silicon cap 312A with gaps 316 there between. In one such embodiment, the etch process is a wet etch process that is hindered by boron-doped silicon and favorably etch N+ silicon, e.g., a hydroxide based wet etch.

Referring to FIG. 3D, and to corresponding operation 508 of flowchart 500, the method includes etching the structure of FIG. 3B to remove the boron-doped silicon cap 312A and to leave remaining a remnant polycrystalline silicon region 306D. In one embodiment, the N+ polycrystalline silicon layer 306 has dopants concentrated at a top of the layer, such that the remnant polycrystalline silicon region 306D is essentially undoped. In an embodiment, the remnant polycrystalline silicon region 306D is laterally spaced apart from the N+ polycrystalline silicon emitter regions 306B, e.g., at locations 316A, by about 20 microns. In an embodiment, the remnant polycrystalline silicon region 306D is a discrete island surrounded by the N+ polycrystalline silicon emitter regions 306B. In one such embodiment, the discrete island has a substantially circular shape from a plan view, or another discrete shape such as a square or a rectangle. In another embodiment, the remnant polycrystalline silicon region 306D is a line. In an embodiment, over an entirety of a back surface of a cell, a totality of the N+ polycrystalline silicon emitter regions 306B occupies greater than 90% of the surface area of the back surface of the substrate of a solar cell (i.e., a totality of the remnant polycrystalline silicon regions 306D occupies less than 10% of the surface area of the back surface of the substrate of the solar cell).

In an embodiment, the etch of FIG. 3C is a poly silicon etch selective to boron, and the etch of FIG. 3D thins the center dot that is not selective to boron. In an embodiment, following the etches of FIGS. 3C and 3D, the thin dielectric layer 304 remains continuous, as is depicted. In another embodiment, following the etches of FIGS. 3C and 3D, exposed portions of the thin dielectric layer 304 are removed, exposing portions of the substrate 302, e.g., as is exemplified in FIG. 4A. In an embodiment, following the etches of FIGS. 3C and 3D, the vertical thickness of the remnant polycrystalline silicon region 306D is in a range of 10%-50% less than the vertical thickness of the N+ polycrystalline silicon emitter regions 306B. In an embodiment, following the etches of FIGS. 3C and 3D, the vertical thickness of the remnant polycrystalline silicon region 306D is about 160 nanometers, and the vertical thickness of the N+ polycrystalline silicon emitter regions 306B is about 220 nanometers.

In an embodiment, referring to operation 510 of flowchart 500, the method then includes doping the remnant polycrystalline silicon region 306D to form a P+ polycrystalline silicon emitter region. In one embodiment, a boron doped silica glass (BSG) layer is formed over the structure of FIG. 3D and is annealed to drive boron dopants into the remnant polycrystalline silicon region 306D. Such a BSG layer may remain in a final structure, e.g., as layer 411 of FIG. 4A described below. In a specific embodiment, this second BSG layer can doped exposed surfaces of the substrate, e.g., to form regions 409A and 409B of FIG. 4A described below. Following processing can include forming conductive contacts to contact the formed P+ polycrystalline silicon emitter region.

Figure 4A:
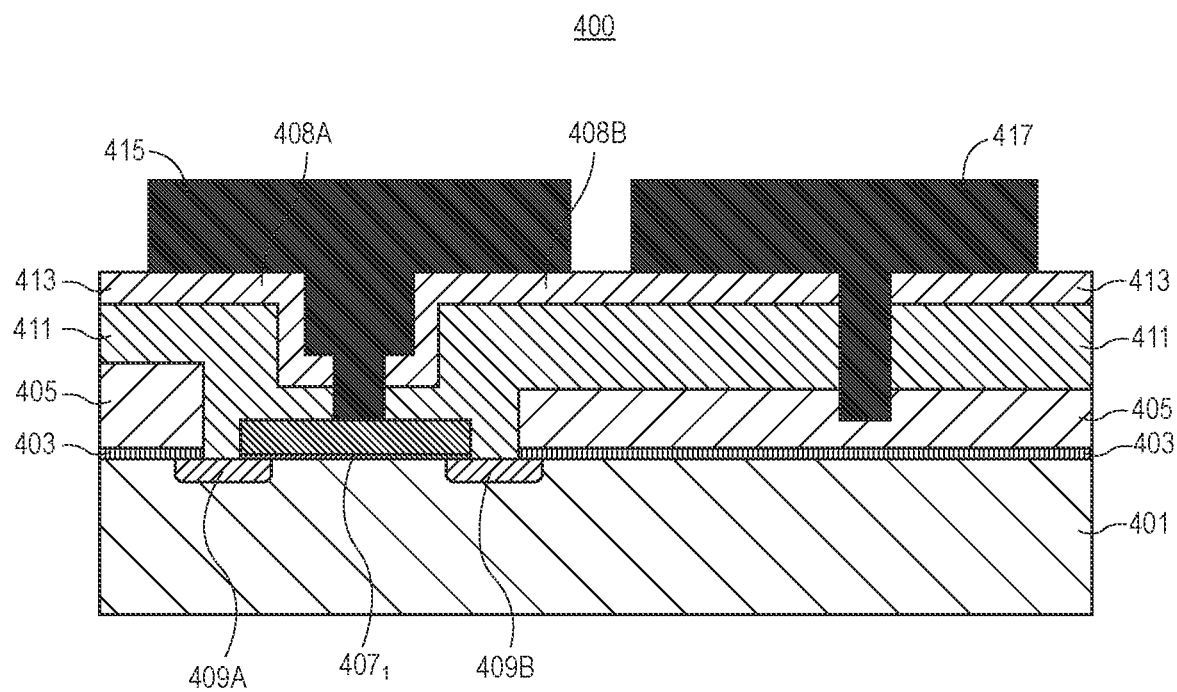
FIG. 4A illustrates a cross-section of a portion of a solar cell, such as a solar cell fabricated according to the method of FIGS. 3A-3D, in accordance with an embodiment of the present disclosure.
Figure 4B:
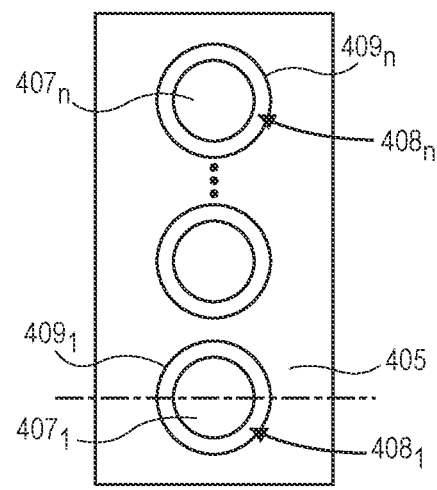
FIG. 4B illustrates an exemplary positioning of a plurality of circular trenches around a plurality of polysilicon structures in the solar cell of FIG. 4A, in accordance with an embodiment of the present disclosure.

As an exemplary solar cell, FIG. 4A illustrates a cross-section of a portion of a solar cell, such as a solar cell fabricated according to the method of FIGS. 3A-3D, in accordance with an embodiment of the present disclosure. FIG. 4B illustrates an exemplary positioning of a plurality of circular trenches around a plurality of polysilicon structures in the solar cell of FIG. 4A, in accordance with an embodiment of the present disclosure. It is to be appreciated that the processes and solar cells described below can be fabricated using one or more process operations or material regimes or operational regimes described in association with FIGS. 1A-1C and 2A-2B and 3A-3D and 5.

In one embodiment, the solar cell 400 includes substrate 401, tunnel oxide 403, n-doped polysilicon 405, p-doped polysilicon $407_1$, trench 408a, trench 408b, doped region 409a, doped region 409b, insulating layer 411, insulating layer 413, wiring layer 415, and wiring layer 417.

Referring to FIG. 4A, the substrate 401 forms the substrate upon which the semiconductor, insulator and wiring layers of the solar cell 400 are formed. In one embodiment, the tunnel oxide 403 is formed on the surface of the substrate 401 and includes spaces through which the doped regions 409a and 409b are formed, and in which the insulating layer 413 is formed. In one embodiment, the p-doped polysilicon layer $407_1$ is formed on a portion of the tunnel oxide 403 that lies between portions of the tunnel oxide 403 located underneath laterally situated portions of the n-doped polysilicon layer 405. In one embodiment, the p-doped polysilicon layer $407_1$ includes sides that are covered by the insulating layer 413 and a top surface that is partially covered by the insulating layer 413. In addition, in one embodiment, the p-doped polysilicon layer $407_1$ is contacted on its top surface through a space in the insulating layer 413 by wiring layer 415. In one embodiment, the n-doped polysilicon layer 405 is formed on the surface of the tunnel oxide 403 and is laterally separated from the p-doped polysilicon layer $407_1$ by portions of the insulating layer 413 that extend into spaces (on both sides of the p-doped polysilicon layer $407_1$) in the tunnel oxide 403. In one embodiment, the doped region 409a is formed in the surface of substrate 401 below a portion of the insulating layer 413 that extends into a first space in the tunnel oxide 403. In one embodiment, the doped region 409a laterally extends underneath a portion of the tunnel oxide 403 that is formed underneath the p-doped polysilicon layer $407_1$ and a portion of the tunnel oxide 403 that is formed underneath the n-doped polysilicon layer 405. In one embodiment, the doped region 409b is formed in the surface of substrate 401 below a portion of the insulating layer 413 that extends into a second space in the tunnel oxide 403. In one embodiment, the doped region 409b laterally extends underneath a portion of the tunnel oxide 403 that is formed underneath the p-doped polysilicon layer $407_1$ and a portion of the tunnel oxide 403 that is formed underneath the n-doped polysilicon layer 405. In one embodiment, the insulating layer 413 is formed above insulating layer 411, along the bottom and sidewalls of the trenches 408a and 408b (that are located above the doped regions 409a and 409b), and on a the top surface of the p-doped polysilicon layer $407_1$. In one embodiment, the insulating layer 413 includes openings above the p-doped polysilicon layer $407_1$ and the n-doped polysilicon layer 405 that enable the p-doped polysilicon layer $407_1$ and the n-doped polysilicon layer 405 to be contacted by the wiring layer 415 and the wiring layer 417 respectively, with various overlaps of such layers possible in a final structure. In one embodiment, the insulating layer 411 is formed above the n-doped polysilicon layer 405 and includes an opening above the n-doped polysilicon layer 405 that enables the n-doped polysilicon layer to be contacted by the wiring layer 417. In one embodiment, trenches 408a and 408b are opposite side cross-sectional parts of a trench (e.g., trench $408_1$ described with reference to FIG. 4B) that surrounds the p-doped polysilicon layer $407_1$.

Referring to FIG. 4A, in one embodiment, wiring layer 415 can occupy a larger area than does the p-doped polysilicon layer $407_1$. However, in other embodiments, the wiring layer 415 can be confined to the area occupied by the p-doped polysilicon layer $407_1$, or to the area occupied by the p-doped polysilicon layer $407_1$ and the area occupied by the p-type doped regions 409a and 409b. In one embodiment, the confinement of the wiring layer 415 to the semiconductor regions of p-type conductivity can involve the use of a larger p-type semiconductor area. In other embodiments, the confinement of the wiring layer 415 to the semiconductor regions of p-type conductivity may not involve the use of a larger p-type semiconductor area. In one embodiment, the wiring layer 415 can be confined to p-type semiconductor regions that do not have continuous or contiguous configurations and can have a cell architecture with module interconnections that can include but is not limited to conductive circuit boards, such as for metallization wrap through (MWT) solar cells and interdigitated back contact (IBC) solar cells.

Referring to FIG. 4B, in one embodiment, the trenches 408a and 408b, shown in FIG. 4A, are opposite side cross-sectional parts of a trench $408_1$ that is formed around the p-doped polysilicon layer $407_1$ and above the doped region $409_1$. Moreover, in one embodiment, the trench $408_1$ is one of a plurality of trenches $408_1$-$408_n$ formed around a plurality of polysilicon islands $407_1$-$407_n$ in solar cell 400 (in FIG. 4B the arrows indicate the location of the trenches $408_1$-$408_n$ relative to the doped regions $409_1$-$409_n$). In one embodiment, the trenches can have shapes that include but are not limited to circular, rectangular, elongated, elliptical, polygonal and irregular. In one embodiment, the polysilicon islands $407_1$-$407_n$ function as emitters that have surface areas that are a fraction of the surface area of the n-doped polysilicon layer 405 (emitter). In one embodiment, the trenches $408_1$-$408_n$ are self-aligned. In one embodiment, the self-alignment enables the formation of a narrower trench than can be obtained by some other processes. In one embodiment, because a diffused trench can form a part of a surface area that may experience elevated levels of recombination, a narrow trench can operate to favorably affect recombination and performance.

In one embodiment, the polysilicon islands $407_1$-$407_n$ are a plurality of non-contiguous doped polysilicon regions of p-type conductivity that are formed in lasered regions of the semiconductor structure. In one embodiment, the wiring layer 415 (FIG. 4A), which is associated with semiconductor regions of p-type polarity (e.g., $407_1$-$407_n$), overlap semiconductor regions of n-type polarity (however in some other embodiments, overlap of the semiconductor regions of one polarity and the metallization associated with semiconductor regions of the other polarity is avoided).

In one embodiment, the substrate 401 can be formed from silicon. In other embodiments, the substrate 401 can be formed from other materials. In one embodiment, the tunnel oxide 403 can be formed from silicon oxide. In other embodiments, the tunnel oxide 403 can be formed from other materials. In one embodiment, the doped polysilicon layer 405 can be doped with phosphorous. In other embodiments, the doped polysilicon layer 405 can be doped with other impurities. In one embodiment, the doped polysilicon layer $407_1$ can be doped with boron. In other embodiments, the doped polysilicon layer $407_1$ can be doped with other impurities. In one embodiment, the doped regions 409a and 409b can be doped with boron. In other embodiments, the doped regions 409a and 409b can be doped with other materials. In one embodiment, the insulating layer 411 can include borosilicate glass (hereinafter "BSG"). In other embodiments, insulating layer 411 can include other materials. In one embodiment, the insulating layer 413 can include silicon nitride (hereinafter "SiN"). In other embodiments, the insulating layer 413 can include other materials. In one embodiment, the wiring layer 415 can include aluminum, nickel, chromium, gold, germanium, copper, silver, titanium, tungsten, tin, platinum, and tantalum. In other embodiments, the wiring layer 415 can include other materials. In one embodiment, the wiring layer 417 can include aluminum, nickel, chromium, gold, germanium, copper, silver, titanium, tungsten, tin, platinum, and tantalum. In other embodiments, the wiring layer 417 can include other materials.

With reference again to FIGS. 4A and 4B, in accordance with an embodiment of the present disclosure, a solar cell 400 includes a substrate 401 having a light-receiving surface and a back surface. A first polycrystalline silicon emitter region 405 of a first conductivity type is on a first thin dielectric layer 403 on the back surface of the substrate 401. A second polycrystalline silicon emitter region $407_1$ of a second, different, conductivity type is on a second thin dielectric layer on the back surface of the substrate 401. The second polycrystalline silicon emitter region $407_1$ has a vertical thickness less than a vertical thickness of the first polycrystalline silicon emitter region.

In one embodiment, the second polycrystalline silicon emitter region $407_1$ includes a plurality of discrete islands $407_n$ surrounded by the first polycrystalline silicon emitter region 405, as is depicted. In one such embodiment, each one of the plurality of discrete islands has a substantially circular shape from a plan view, as is depicted. In another embodiment, the second polycrystalline silicon emitter region $407_1$ includes a plurality of lines alternating with lines of the first polycrystalline silicon emitter region 405 (not depicted).

In one embodiment, the first polycrystalline silicon emitter region 405 occupies greater than 90% of the surface area of the back surface of the substrate 401.

In one embodiment, the first polycrystalline silicon emitter region 405 is n-type, and the second polycrystalline silicon emitter region $407_1$ is p-type. In another embodiment, the first polycrystalline silicon emitter region 405 is p-type, and the second polycrystalline silicon emitter region $407_1$ is n-type.

In one embodiment, the first thin dielectric layer 403 is discontinuous from the second thin dielectric layer, as is depicted. In another embodiment, the first thin dielectric layer 403 is continuous with the second thin dielectric layer (not depicted in FIG. 4A, but an example of which is depicted in FIG. 3D).

In one embodiment, the vertical thickness of the second polycrystalline silicon emitter region $407_1$ is in a range of 10%-50% less than the vertical thickness of the first polycrystalline silicon emitter region 405. In one embodiment, the vertical thickness of the second polycrystalline silicon emitter region $407_1$ is about 160 nanometers, and the vertical thickness of the first polycrystalline silicon emitter region 405 is about 200 nanometers.

In one embodiment, the second polycrystalline silicon emitter region $407_1$ is laterally spaced apart from the first polycrystalline silicon emitter region 405 by about 20 microns.

In one embodiment, the solar cell further includes a first conductive contact structure 417 electrically connected to the first polycrystalline silicon emitter region 405, and a second conductive contact structure 415 electrically connected to the second polycrystalline silicon emitter region $407_1$.

In operation, upon exposure to light, the solar cell 400 converts light energy into electricity based on the photovoltaic effect. Some carriers reach the p-n junction and contribute to the current produced by the solar cell 400. However, other carriers recombine with no net contribution to the current produced by the solar cell 400. Carrier recombination is a significant factor in the determination of solar cell efficiency. Diffused trenches can be the part of the surface of the solar cell 400 that has the least favorable recombination properties. However, in one embodiment, the narrowness of the diffused trenches 408a and 408b that is enabled by the self-alignment process, can be beneficial as regards carrier recombination in that part of the surface of the solar cell 400. Metal contacted doped regions are another significant source of carrier recombination. In one embodiment, the solar cell 400 does not employ a direct metal contact of any part of the substrate 401. Thus, the solar cell 400 is designed in a manner that limits the opportunities for carrier recombination that may be available with differently designed solar cells. In one embodiment, the limiting of opportunities for carrier recombination can have a favorable effect on carrier recombination and solar cell efficiency.

In accordance with one or more embodiments of the present disclosure, SEM cross-section can be used to detect the regions of poly within the P type region with a small ring of no poly and a thickness difference between the P poly and the surrounding field. In one embodiment, the approach is useful for IBC solar cells. In one embodiment, the approach is useful for front contact solar cells.

In accordance with one or more embodiments of the present disclosure, a process described herein allows creation of poly in P type regions. An etch back version of the process uses Pre-doped Npoly. Pre-doping necessitates etch back of dot with non-boron selective chemistry. Pre-doped Npoly alleviates space charge recombination issue. The method can possibly be used on front contact cells to form poly that would be aligned to grid lines.

Thus, one or more embodiments described herein are directed to forming P+ and N+ polysilicon emitter regions for a solar cell where the respective layouts of the P+ and N+ polysilicon emitter regions are different from one another. Such an approach can be implemented to simplify a solar cell fabrication process. Furthermore, the resulting structure may provide a lower breakdown voltage and lower power losses associated as compared with other solar cell architectures.

Although certain materials are described specifically with reference to above described embodiments, some materials can be readily substituted with others with such embodiments remaining within the spirit and scope of embodiments of the present disclosure. For example, in an embodiment, a different material substrate, such as a group III-V material substrate, can be used instead of a silicon substrate. Additionally, although reference is made significantly to back contact solar cell arrangements, it is to be appreciated that approaches described herein can have application to front contact solar cells as well. In other embodiments, the above described approaches can be applicable to manufacturing of other than solar cells. For example, manufacturing of light emitting diode (LEDs) can benefit from approaches described herein. Furthermore, it is to be appreciated that, where N+ and P+ type doping is described specifically, other embodiments contemplated include the opposite conductivity type, e.g., P+ and N+ type doping, respectively.

Furthermore, in an embodiment, a cluster plasma enhanced chemical vapor deposition (PECVD) tool can be used to combine many of the above described process operations in a single pass in a process tool. For example, in one such embodiment, up to four distinct PECVD operations and an RTP operation can be performed in a single pass in a cluster tool. The PECVD operations can includes depositions of layers such as the above described back side N+ polysilicon layer.

Thus, methods of fabricating solar cell emitter regions with differentiated P-type and N-type layouts and incorporating dotted diffusion, and the resulting solar cells, have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments can be variously combined with some features included and others excluded to suit a variety of different applications.

Example embodiment 1: A solar cell includes a substrate having a light-receiving surface and a back surface. A first polycrystalline silicon emitter region of a first conductivity type is on a first thin dielectric layer on the back surface of the substrate. A second polycrystalline silicon emitter region of a second, different, conductivity type is on a second thin dielectric layer on the back surface of the substrate. The second polycrystalline silicon emitter region has a vertical thickness less than a vertical thickness of the first polycrystalline silicon emitter region.

Example embodiment 2: The solar cell of example embodiment 1, wherein the second polycrystalline silicon emitter region includes a plurality of discrete islands surrounded by the first polycrystalline silicon emitter region.

Example embodiment 3: The solar cell of example embodiment 2, wherein each one of the plurality of discrete islands has a substantially circular shape from a plan view.

Example embodiment 4: The solar cell of example embodiment 1, wherein the second polycrystalline silicon emitter region includes a plurality of lines alternating with lines of the first polycrystalline silicon emitter region.

Example embodiment 5: The solar cell of example embodiment 1, 2, 3 or 4, wherein the first polycrystalline silicon emitter region occupies greater than 90% of the surface area of the back surface of the substrate.

Example embodiment 6: The solar cell of example embodiment 1, 2, 3, 4 or 5, wherein the first polycrystalline silicon emitter region is n-type, and the second polycrystalline silicon emitter region is p-type.

Example embodiment 7: The solar cell of example embodiment 1, 2, 3, 4 or 5, wherein the first polycrystalline silicon emitter region is p-type, and the second polycrystalline silicon emitter region is n-type.

Example embodiment 8: The solar cell of example embodiment 1, 2, 3, 4, 5, 6 or 7, wherein the first thin dielectric layer is discontinuous from the second thin dielectric layer.

Example embodiment 9: The solar cell of example embodiment 1, 2, 3, 4, 5, 6 or 7, wherein the first thin dielectric layer is continuous with the second thin dielectric layer.

Example embodiment 10: The solar cell of example embodiment 1, 2, 3, 4, 5, 6, 7, 8 or 9, wherein the vertical thickness of the second polycrystalline silicon emitter region is in a range of 10%-50% less than the vertical thickness of the first polycrystalline silicon emitter region.

Example embodiment 11: The solar cell of example embodiment 1, 2, 3, 4, 5, 6, 7, 8, 9 or 10, wherein the vertical thickness of the second polycrystalline silicon emitter region is about 160 nanometers, and the vertical thickness of the first polycrystalline silicon emitter region is about 200 nanometers.

Example embodiment 12: The solar cell of example embodiment 1, 2, 3, 4, 5, 6, 7, 8, 9, 10 or 11, wherein the second polycrystalline silicon emitter region is laterally spaced apart from the first polycrystalline silicon emitter region by about 20 microns.

Example embodiment 13: The solar cell of example embodiment 1, 2, 3, 4, 5, 6, 7, 8, 9, 10, 11 or 12, further including a first conductive contact structure electrically connected to the first polycrystalline silicon emitter region, and a second conductive contact structure electrically connected to the second polycrystalline silicon emitter region.

Example embodiment 14: A method of fabricating a solar cell includes forming an N+ polycrystalline silicon layer on a thin dielectric layer on a back surface of a substrate, forming a boron doped silica glass (BSG) layer on the N+ polycrystalline silicon layer, forming an amorphous silicon (aSi) layer on the BSG layer, performing laser ablating to form an opening in the aSi layer and the BSG layer and to dope a region of the N+ polycrystalline silicon layer and to leave outer unmodified regions of the N+ polycrystalline silicon layer exposed, etching to remove the exposed outer unmodified regions of the N+ polycrystalline silicon layer to form N+ polycrystalline silicon emitter regions and a remnant polycrystalline silicon region beneath a boron-doped silicon cap, etching to remove the boron-doped silicon cap and to leave remaining a remnant polycrystalline silicon region, and doping the remnant polycrystalline silicon region to form a P+ polycrystalline silicon emitter region.

Example embodiment 15: The method of example embodiment 14, wherein the laser ablating is performed using a green laser having a top-hat profile.

Example embodiment 16: The method of example embodiment 14 or 15, wherein forming the opening includes forming a discrete circle.

Example embodiment 17: The method of example embodiment 14 or 15, wherein forming the opening includes forming a line.

Example embodiment 18: A method of fabricating a solar cell includes providing a substrate having a light-receiving surface and a back surface, forming a first polycrystalline silicon emitter region of a first conductivity type on a first thin dielectric layer on the back surface of the substrate, and forming a second polycrystalline silicon emitter region of a second, different, conductivity type on a second thin dielectric layer on the back surface of the substrate, the second polycrystalline silicon emitter region having a vertical thickness less than a vertical thickness of the first polycrystalline silicon emitter region.

Example embodiment 19: The method of example embodiment 18, wherein forming the second polycrystalline silicon emitter region includes forming a plurality of discrete islands surrounded by the first polycrystalline silicon emitter region.

Example embodiment 20: The method of example embodiment 18, wherein forming the second polycrystalline silicon emitter region includes forming a plurality of lines alternating with lines of the first polycrystalline silicon emitter region.

What is claimed is:

1. A solar cell, comprising:
   a substrate having a light-receiving surface and a back surface;
   a first polycrystalline silicon emitter region of a first conductivity type on a first thin dielectric layer on the back surface of the substrate;
   a second polycrystalline silicon emitter region of a second, different, conductivity type on a second thin dielectric layer on the back surface of the substrate, wherein the second polycrystalline silicon emitter region has a vertical thickness less than a vertical thickness of the first polycrystalline silicon emitter region, wherein the second polycrystalline silicon emitter region has a bottommost surface at a same level as a bottommost surface of the first polycrystalline silicon emitter region, and wherein the second polycrystalline silicon emitter region does not vertically overlap with the first polycrystalline silicon emitter region;
   an insulating layer on a top surface of the first polycrystalline silicon emitter region, on a top surface of the second polycrystalline silicon emitter region, along sides of second polycrystalline silicon emitter region, and along a side of the first polycrystalline silicon emitter region, wherein the insulating layer has a vertical thickness over the first polycrystalline silicon emitter region greater than a vertical thickness of the insulating layer over the second polycrystalline silicon emitter region; and
   a conductive contact structure over and extending through the insulating layer to directly contact the second polycrystalline silicon emitter region, wherein the conductive contact structure is vertically overlapping with but separated from the first polycrystalline silicon emitter region along a vertical axis.

2. The solar cell of claim 1, wherein the second polycrystalline silicon emitter region comprises a plurality of discrete islands surrounded by the first polycrystalline silicon emitter region.

3. The solar cell of claim 2, wherein each one of the plurality of discrete islands has a substantially circular shape from a plan view.

4. The solar cell of claim 1, wherein the second polycrystalline silicon emitter region comprises a plurality of lines alternating with lines of the first polycrystalline silicon emitter region.

5. The solar cell of claim 1, wherein the first polycrystalline silicon emitter region occupies greater than 90% of the surface area of the back surface of the substrate.

6. The solar cell of claim 1, wherein the first polycrystalline silicon emitter region is n-type, and the second polycrystalline silicon emitter region is p-type.

7. The solar cell of claim 1, wherein the first polycrystalline silicon emitter region is p-type, and the second polycrystalline silicon emitter region is n-type.

8. The solar cell of claim 1, wherein the first thin dielectric layer is discontinuous from the second thin dielectric layer.

9. The solar cell of claim 1, wherein the first thin dielectric layer is continuous with the second thin dielectric layer.

10. The solar cell of claim 1, wherein the vertical thickness of the second polycrystalline silicon emitter region is in a range of 10%-50% less than the vertical thickness of the first polycrystalline silicon emitter region.

11. The solar cell of claim 1, wherein the vertical thickness of the second polycrystalline silicon emitter region is about 160 nanometers, and the vertical thickness of the first polycrystalline silicon emitter region is about 200 nanometers.

12. The solar cell of claim 1, wherein the second polycrystalline silicon emitter region is laterally spaced apart from the first polycrystalline silicon emitter region by about 20 microns.

13. The solar cell of claim 1, further comprising:
   a second conductive contact structure electrically connected to the first polycrystalline silicon emitter region.

* * * * *